United States Patent [19]

Fountain

[11] Patent Number: 5,798,674

[45] Date of Patent: Aug. 25, 1998

[54] BAND LIMITED AM MODULATOR USING LINEAR POWER AMPLIFICATION

[75] Inventor: Eric Fountain, Irvine, Calif.

[73] Assignee: Raytheon Company, Lexington, Mass.

[21] Appl. No.: 835,775

[22] Filed: Apr. 8, 1997

[51] Int. Cl.[6] .................. H03C 1/06; H04L 27/04; H04L 27/08; H04B 1/04
[52] U.S. Cl. .................. 332/149; 332/150; 332/155; 332/160; 332/162; 375/297; 375/300; 455/108; 455/115; 455/126
[58] Field of Search .................. 332/149, 150, 332/155, 159, 160, 162; 375/268, 270, 296, 297, 300, 301; 455/108, 109, 115, 126, 127

[56] References Cited

U.S. PATENT DOCUMENTS

| | | | |
|---|---|---|---|
| 4,890,300 | 12/1989 | Andrews | 375/60 |
| 5,113,525 | 5/1992 | Andoh | 455/127 |
| 5,241,694 | 8/1993 | Väis/änen et al. | 455/126 |

*Primary Examiner*—David Mis
*Attorney, Agent, or Firm*—Georgann S. Grunebach; William C. Schubert

[57] ABSTRACT

A band limited Amplitude Shift Keyed (ASK) modulator employing linear modulation and an efficient Class C power amplifier. Band-limited operation is provided by filtering a digital baseband input signal prior to modulation. Closed loop feedback is employed around the amplifier to assure linear modulation over a wide modulation range which preserves the frequency characteristics of the baseband signal on the modulation envelope. Further filtering is accomplished by exploiting the closed loop system response, incorporating it in the filter characteristic as an added filter pole.

9 Claims, 2 Drawing Sheets

BAND LIMITED AM MODULATOR USING LINEAR POWER AMPLIFICATION

BACKGROUND

The present invention relates generally to dry AM modulators, and more particularly, to a band limited AM modulator employing linear power amplification.

AM modulation and ASK modulation in particular has been used for many years because it is very simple to implement. When spectral bandwidth limiting is required, it has been accomplished by filtering the spectrum after modulation. In order to preserve the spectral characteristics, however, all amplification after the modulation stage must be linear. Linear amplifiers exhibit power efficiencies typically in the 20% to 30% range. This means, for example, that if a 3 Watt output power is desired, 15 Watts of power is needed from a power source and 12 Watts of power is dissipated as heat.

Class C amplifiers typically exhibit power efficiencies in the 40% to 80% range. This type of amplifier has not been useful for AM applications because the output power does not vary linearly with input power. This nonlinear response is undesirable because it distorts the AM waveform and results in increased spectral sideband energy.

In applications where multiple users share the same frequency band of operation, it often necessary to limit the bandwidth of transmitted signals to prevent interference with adjacent channels. For example, the Federal Communication Commission restricts operation of Location and Monitoring Service users to 14.7 dBW signal power in the 909.75 MHz to 921.75 MHz band and attenuation to 55+10 log(P) dB or −55 dBW outside of the band segment (Part 90 subpart M). This means that the spectral energy at the band edges must be −25 dBm or lower. ASK modulation consists of sending a digital 1 or 0 by varying the amplitude of a carrier between two discrete levels. Due to the Sin(x)/x nature of the pulsed modulating waveform, the modulated signal contains high levels of harmonics and requires techniques to reject the significant amount of energy present at the band edges.

Accordingly, it is an objective of the present invention to provide for a band limited AM modulator employing more efficient Class C power amplification.

SUMMARY OF THE INVENTION

To meet the above and other objectives, the present invention provides for a band limited Amplitude Shift Keyed (ASK) modulator using a unique linear modulation technique and an efficient Class C power amplifier. Band-limited operation is provided by filtering a digital baseband input signal prior to modulation. Closed loop feedback is employed around the amplifier to assure linear modulation over a wide modulation range which preserves the frequency characteristics of the baseband signal on the modulation envelope. Further filtering is accomplished by exploiting the closed loop system response, incorporating it in the filter characteristic as an added filter pole.

The approach of the present invention rejects modulation harmonics by shaping the baseband digital signal and performing linear modulation. Shaping is accomplished by using a low pass filter in a manner that minimally impacts the information content of the modulating waveform while rejecting the undesirable higher order harmonics. The order of the filter is determined by the spectral rejection requirements of the transmitted signal. To preserve the spectral properties of the baseband signal, the modulation is accomplished with minimal distortion. This approach insures linearity by employing feedback control techniques.

The present invention uses the Class C power amplifier for improved power efficiency. However, the present invention provides a linear modulation characteristic by monitoring the supply current of the power amplifier which is proportional to output power. This current is scaled and instantaneously compared to the desired modulation envelope. The input signal to the power amplifier is varied using a feedback loop such that the scaled output current and input modulation are identical. Thus the output of the power amplifier is always linearly proportional to the modulation input.

The present invention eliminates the use of expensive narrow band, high frequency filters and the high power consumption associated with Class A linear amplifiers. Considerable cost and power savings are realized using the approach of the present invention.

BRIEF DESCRIPTION OF THE DRAWINGS

The various features and advantages of the present invention may be more readily understood with reference to the following detailed description taken in conjunction with the accompanying drawings, wherein like reference numerals represent like structural elements, and in which.

DETAILED DESCRIPTION

Figure 1:
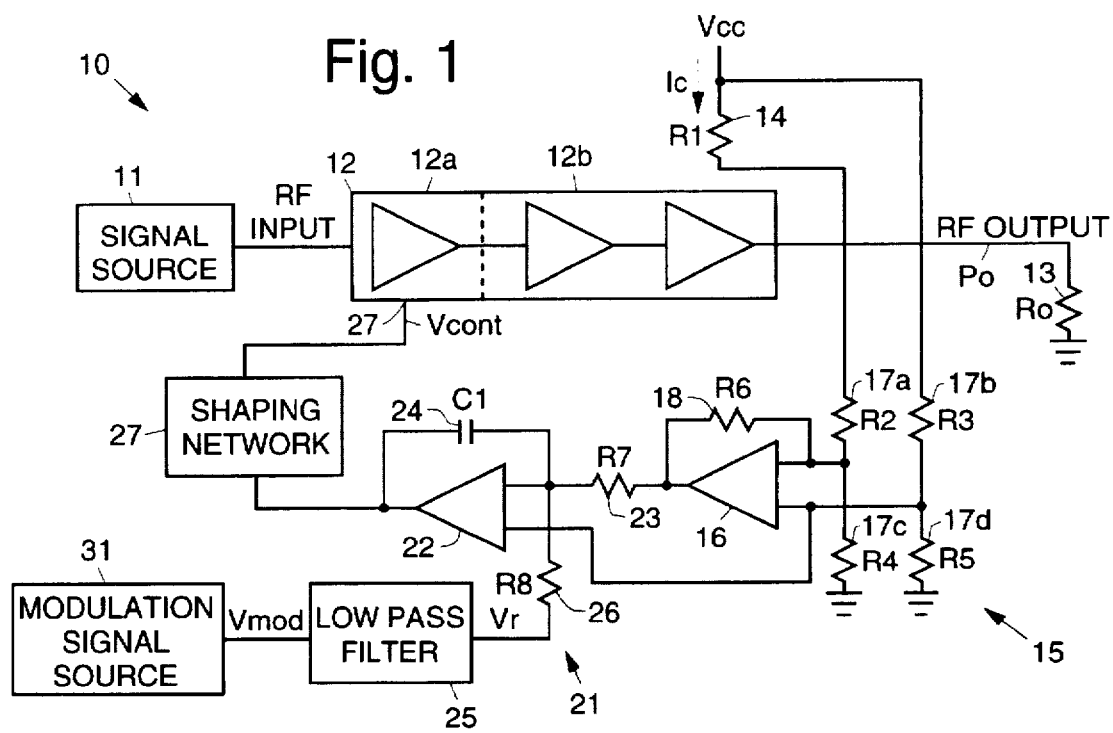
FIG. 1 illustrates a block diagram of an AM modulator in accordance with the principles of the present invention.

Referring to the drawing figures, FIG. 1 illustrates a block diagram of an AM modulator 10, and in particular an ASK modulator 10, in accordance with the principles of the present invention. The ASK modulator 10 comprises an RF signal source 11 whose output is coupled to a power amplifier 12 which generates an RF output signal that is coupled to a load 13 (Ro). Although a number of commercially available amplifier modules or discrete power amplifier designs may be used in the ASK modulator 10, a Motorola MHW806A power amplifier 12 was chosen because of its low cost and modular design which resulted in a low overall component count for the ASK modulator 10. The Motorola MHW806A power amplifier 12 includes a variable gain stage 12a that precedes a Class C amplifier stage 12b.

In order to control the output level of the power amplifier 12, it must first be measured. There are several ways to accomplish this. Diode detection may be used, but a coupling network is required to permit a small portion of the total output power to be sampled. The chosen approach was to measure the current supplied to the power amplifier 12, which is proportional to output power. This is a far simpler, only requiring a supply line resistor 14 (R1) to be disposed in a supply line from a voltage supply Vcc. The power efficiency of the power amplifier 12 is defined as:

$\eta = Po/(Vcc \cdot Ic)$.

Thus:

$Po = k \cdot Ic$ where $k = \eta \cdot Vcc$.

The supply line resistor 14 is used to convert power amplifier current (Ic) into a voltage. The value of the supply line resistor 14 is selected to cause a minimal voltage drop at the collector of the power amplifier 12, and typically is less than 1 ohm. The voltage developed across the supply line resistor 14 is amplified by a differential amplifier 15 that comprises a first differential operational amplifier 16, four divider resistors 17a–17d (R2–R6) and a feedback resistor 18. The output voltage (VI) of the first differential operational amplifier 16 is proportional to output power. The output voltage (VI) of the first differential operational amplifier 16 is given by:

$V1 = Po/k \cdot R1 \cdot R6/R2 = k_1 \cdot Po$, where $k_1 = R1/k \cdot R6/R2$.

The output of the first differential operational amplifier 16 is applied to an integrator 21 that comprises a second differential operational amplifier 22, an input resistor 23 (R7), and a filter capacitor 24 (C1). A modulation voltage signal (Vmod) derived from a modulation voltage signal source 31 is coupled by way of a low pass filter 25 to produce a low pass filtered modulation voltage signal, or loop reference signal (Vr), that is applied to the integrator 21 through a second input resistor 26 (R8). The response (Vo) of the integrator 21 is given by:

$Vo = 1/(s \cdot R7 \cdot C1) = k_2/s$, where $k_2 = 1/(R7 \cdot C1)$.

The output of the integrator 21 is coupled by way of a shaping network 27, or diode shaping network 27, to an amplifier control port 28 of the variable gain stage 12a that precedes the Class C amplifier 12b in the MHW806A amplifier 12. Although the variable gain stage 12a is built into the MHW806A amplifier 12, alliterative devices may be used such as a PIN diode attenuator or a gallium arsenide (GaAs) attenuator if such a variable gain stage 12a is not part of a selected amplifier 12.

The purpose of the variable gain stage 12a is to vary the signal level at the input to the Class C amplifier stage 12b which causes the output power level of the Class C amplifier stage 12b to vary. The relationship between input power and output power in the Class C amplifier stage 12b is nonlinear. Thus the control characteristic for the variable gain stage 12a is nonlinear. In order for a closed loop response to be constant for varying output levels, a linear control characteristic is necessary. This problem is addressed in the ASK modulator 10 by the use of the diode shaping network 27 disposed between the integrator 21 and the amplifier control port 28. This provides a first order linear control characteristic, ka, over a limited operating range.

Thus, a closed loop is formed. The loop reference (Vr) is the low pass filtered modulation voltage provided by the low pass filter 25. The controlled parameter is the output power, Po, of the amplifier 12. The loop response is given by the equation:

$H(s) = Po(s)/Vin(s) = (k_1 \cdot k_2 \cdot k_a)/[s + (k_1 \cdot k_2 \cdot k_a)]$.

The loop response is a single pole low pass function with a 3 dB corner frequency, $\omega$, equal to $k_1 \cdot k_2 \cdot k_a$. The first and second differential operational amplifiers 16, 22 are chosen to have bandwidths sufficiently wide not to affect the loop response.

The low pass filter 25 can include active circuitry or passive lumped elements. The general response for a typical four-pole low pass filter 25 is given by the equation:

$H1(s) = Vr/Vmod = k_a/(s + \omega_a) \cdot k_b/(s + \omega_b) \cdot k_c/(s + \omega_c) \cdot k_d/(s + \omega_d)$.

The poles, $\omega_a$, $\omega_b$, $\omega_c$ and $\omega_d$ are chosen to provide the desired low pass response for the given modulation waveform. The Handbook of Filter Synthesis by Anatol Zverev has tabulated listings of normalized values for these pole values and is a valuable aid for use in designing the filter 25. The values $k_1 \cdot k_2 \cdot k_a$ are chosen to be equal to one of these poles while the three remaining poles are provided by the low pass filter 25. Although a four-pole response was chosen for use in the ASK modulator 10, higher or lower orders may readily be used. In general, to avoid loss of information content in the modulation waveform (Vmod), the 3 dB corner frequency of the filter 25 is set to be three times the maximum baseband frequency of the modulation waveform signal. For example if the data rate is 500 kilobits per second, the corner of the filter 25 is set at 1.5 MHz.

Band-limited operation of the ASK modulator 10 is provided by filtering the digital baseband input signal (Vmod) prior to modulation. Closed loop feedback is employed around the amplifier 12 to assure linear modulation over a wide modulation range which preserves the frequency characteristics of the baseband signal on the modulation envelope. Further filtering is accomplished by exploiting the closed loop system response of the ASK modulator 10, incorporating it in the filter characteristic as an added filter pole.

The present invention rejects modulation harmonics by shaping the baseband signal (Vmod) and then linearly modulating the baseband signal. Shaping is accomplished by using the low pass filter 25 in a manner that minimally impacts the information content of the modulating waveform while rejecting undesirable higher order harmonics. The order of the filter 25 is determined by the spectral rejection requirements of the transmitted signal. To preserve the spectral properties of the baseband signal, modulation is accomplished with minimal distortion.

The Class C power amplifier 12 is used to provide improved power efficiency. The ASK modulator 10 provides a linear modulation characteristic by monitoring the supply current of the power amplifier 12 which is proportional to output power. This current is scaled and instantaneously compared to the desired modulation envelope. The input signal to the Class C amplifier 12 is varied using a feedback loop such that the scaled output current and input modulation are identical. Thus the output of the Class C amplifier 12 is always linearly proportional to the modulation input signal (Vmod).

One application for the ASK modulator 10 is in a Vehicle to Roadside Communication (VRC) Reader employed in a toll collection system developed by the assignee of the present invention. The VRC Reader is used to communicate with a vehicle-mounted transponder. The ASK modulator 10 replaces a portion of the existing VRC Reader, eliminating one circuit card and a cavity filter. In addition, because the cavity filter and its associated insertion loss are eliminated, more transmit power is available from the Reader. This allows greater signal margin at the transponder, or permits greater losses between the VRC Reader and its antenna. Alternatively, lower cost cable or longer cable runs may be used. The ASK modulator 10 may also be used to in a battery operated portable version of the VRC Reader where small size and low power consumption are vital.

Figure 2:
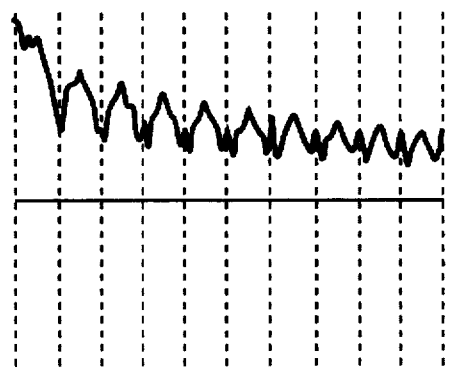
FIG. 2 illustrates a baseband waveform of the AM modulator of FIG. 1.
Figure 3:
FIG. 3 illustrates a filtered baseband waveform of the AM modulator of FIG. 1.
Figure 4:
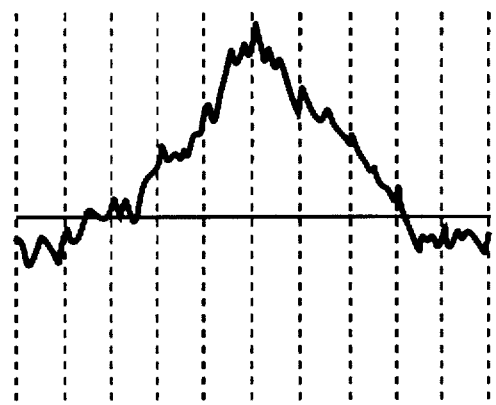
FIG. 4 illustrates an output spectrum of the AM modulator of FIG. 1.
Figure 5:
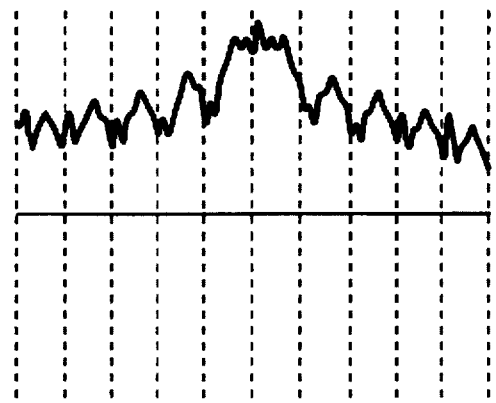
FIG. 5 illustrates the output of a VRC Reader with no filtering.
Figure 6:
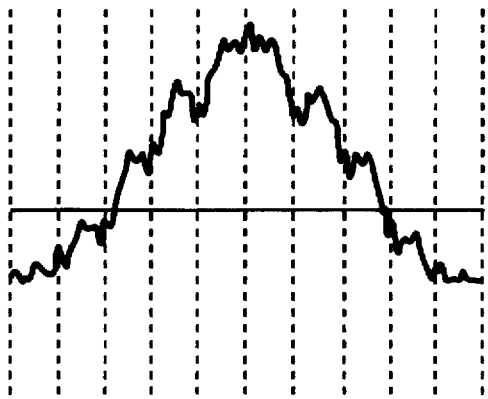
FIG. 6 illustrates the output of the VRC Reader having a cavity filter.

A prototype ASK modulator 10 was built to verify the design. The baseband modulation voltage signal, Vmod, included a Manchester coded 500 kb/s data signal generated by a digital portion of a VRC Reader developed by the assignee of the present invention for use in a toll collection system. FIG. 2 shows the frequency spectrum of an unfiltered baseband modulation voltage signal, Vmod. A three pole filter 25 with a corner of 1.5 MHz was used to shape this waveform. FIG. 3 shows the baseband modulation voltage signal after the filter 25 (using a three pole filter response). The output of the filter 25 was used to modulate the output of the ASK modulator 10. The spectrum of the output of the modulator 10 is shown in FIG. 4. For comparison, the unfiltered output and a cavity filtered output of the VRC Reader is shown in FIGS. 5 and 6, respectively. The results show that the prototype ASK modulator 10 provides sufficient sideband rejection using feedback control techniques and prefiltering of the modulation waveform, Vmod, to equal the performance of a modulator using a cavity filter to limit the frequency spectrum.

Thus, a band limited AM modulator employing linear power amplification has been disclosed. It is to be understood that the described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A band limited AM modulator comprising:

an RF signal source;

a power amplifier coupled to the RF signal source for generating an RF output signal, and wherein the power amplifier comprises a variable gain stage coupled to a Class C amplifier stage;

means for measuring output power of the power amplifier;

an integrator coupled to the output of the means for measuring output power of the power amplifier;

means for producing a low pass filtered modulation voltage signal coupled to the integrator; and a shaping network coupled between the integrator and the variable gain stage of the amplifier.

2. The modulator of claim 1 wherein the means for measuring the output power of the power amplifier comprises means for measuring the current supplied to the power amplifier.

3. The modulator of claim 2 wherein the means for measuring the current supplied to the power amplifier comprises:

a supply line resistor disposed in a supply line from a voltage supply to the power amplifier; and a differential amplifier for amplifying the voltage developed across the supply line resistor.

4. The modulator of claim 3 wherein the differential amplifier comprises a first differential operational amplifier, a plurality of divider resistors and a feedback resistor coupled across the first differential operational amplifier, and wherein output voltage of the first differential operational amplifier is proportional to the output power of the power amplifier.

5. The modulator of claim 4 wherein the integrator comprises a second differential operational amplifier, an input resistor, and a filter capacitor coupled across the second differential operational amplifier.

6. The modulator of claim 5 wherein the means for producing a low pass filtered modulation voltage signal comprises:

a modulation voltage signal source for generating a modulation voltage signal; and a low pass filter for generating a low pass filtered modulation voltage signal that is applied to the integrator through a second input resistor.

7. The modulator of claim 1 wherein the variable gain stage comprises a PIN diode attenuator.

8. The modulator of claim 1 wherein the variable gain stage comprises a gallium arsenide attenuator.

9. The modulator of claim 1 wherein the shaping network is coupled between the integrator and an amplifier control port of the variable gain stage of the amplifier.

\* \* \* \* \*